United States Patent [19]
Nakagawa

[11] Patent Number: 5,345,097
[45] Date of Patent: Sep. 6, 1994

[54] HETEROJUNCTION BIPOLAR TRANSISTOR INCLUDING COLLECTOR REGION OF INP AND METHOD OF FABRICATING THE SAME

[75] Inventor: Atsushi Nakagawa, Kawanishi, Japan

[73] Assignee: Matsushita Electric Industrial, Co., Ltd., Osaka, Japan

[21] Appl. No.: 948,551

[22] Filed: Sep. 23, 1992

[30] Foreign Application Priority Data

Mar. 2, 1992 [JP] Japan .................................. 4-044403

[51] Int. Cl.$^5$ .................. H01L 29/161; H01L 29/205; H01L 225
[52] U.S. Cl. .................................... 257/198; 257/187; 257/191; 257/197; 257/586; 437/126; 437/133
[58] Field of Search ............... 257/187, 191, 197, 198, 257/586; 437/126, 133

[56] References Cited

U.S. PATENT DOCUMENTS

| 4,821,082 | 4/1989 | Frank et al. | 357/34 |
| 5,010,382 | 4/1991 | Katoh | 257/15 |
| 5,153,461 | 10/1992 | Takatsu | 307/464 |

FOREIGN PATENT DOCUMENTS

| 61-203675 | 9/1986 | Japan . |
| 62-139354 | 6/1987 | Japan . |
| 2-280338 | 11/1990 | Japan . |

OTHER PUBLICATIONS

"Real-Space Transfer And Hot-Electron Transport Properties in III-V Semiconductor Heterostructures" by Sakamoto et al; IEEE Transactions On Electron Devices, vol. 36 No. 10, Oct. 1989; pp., 2344–2352.

"NpnN Double-Heterojunction Bipolar Transistor on InGaAsP/InP" by Kaumanns et al; Appl. Phys. Lett. 47(1), Jul. 1, 1985; pp., 28–30.

"Fully Self-Aligned ALGaAs.GaAs HBT with ALGSaAs Passivation Layer" by Hayama et al; ED89-147; pp., 67-74 (English abstract is attached).

"Subpicosecond InP/InGaAs Heterostructure Bipolar Transistors" by Chen et al; IEEE Electron Device Letters, vol. 10, No. 6, Jun. 1989; pp., 267–269.

"High-Current-Gain InGaAs/InP Double-Heterojunction Bipolar Transistors Grown By Metal Organic Vapor Phase Epitaxy" by Sugiura et al; IEEE Electron Device Letters, vol. 9, No. 5, May 1988; pp., 253–255.

"A Tunneling Emitter Bipolar Transistor" by Xu et al; IEEE Electron Device Letters, vol. EDL-7, No. 7, Jul. 1986; pp., 416–418.

Primary Examiner—Ngen Van Ngo
Attorney, Agent, or Firm—Lowe, Price, LeBlanc & Becker

[57] ABSTRACT

A heterojunction bipolar transistor includes a collector region made of first-conduction-type InP. and a base region connected to the collector region and made of second-conduction-type $In_x(Ga_yAl_{1-y})_{1-x}As$ where the letters "x" and "y" denote predetermined atomic fractions. The atomic fraction "x" is in the range of 0.52 to 0.53. The atomic fraction "y" is in the range of 0.35 to 0.72.

5 Claims, 8 Drawing Sheets

HETEROJUNCTION BIPOLAR TRANSISTOR INCLUDING COLLECTOR REGION OF INP AND METHOD OF FABRICATING THE SAME

BACKGROUND OF THE INVENTION

This invention relates to a heterojunction bipolar transistor (HBT). This invention also relates to a method of fabricating a heterojunction bipolar transistor.

Heterojunction bipolar transistors (HBT's) are advantageous in high-speed operation. Various types of HBT's have been developed. As will be explained later, prior art HBT's have some problems.

SUMMARY OF THE INVENTION

It is an object of this invention to provide an improved heterojunction bipolar transistor.

It is another object of this invention to provide a method of fabricating an improved heterojunction bipolar transistor.

A first aspect of this invention provides a heterojunction bipolar transistor comprising a collector region made of first-conduction-type InP; and a base region connected to the collector region and made of second-conduction-type $In_x(Ga_yAl_{1-y})_{1-x}As$ where the letters "x" and "y" denote predetermined atomic fractions, wherein the atomic fraction "x" is in the range of 0.52 to 0.53 and the atomic fraction "y" is in the range of 0.35 to 0.72.

A second aspect of this invention provides a heterojunction bipolar transistor comprising a collector region made of first-conduction-type InP; a base region connected to the collector region and made of second-conduction-type InP; a first emitter region connected to the base region and made of first-conduction-type $In_x(Ga_yAl_{1-y})_{1-x}P$ where the letters "x" and "y" denote predetermined atomic fractions, wherein the atomic fraction "x" is in the range of 0.7 to 0.9 and the atomic fraction "y" is in the range of 0.0 to 0.9; and a second emitter region connected to the first emitter region, wherein the first emitter region extends between the base region and the second emitter region.

A third aspect of this invention provides a heterojunction bipolar transistor comprising a collector region made of first-conduction-type InP; a base region connected to the collector region and made of second-conduction-type InP; a barrier region connected to the base region and made of non-doped $In_x(Ga_yAl_{1-y})_{1-x}P$ where the letters "x" and "y" denote predetermined atomic fractions, wherein the atomic fraction "x" is in the range of 0.7 to 0.9 and the atomic fraction "y" is in the range of 0.0 to 0.9; and an emitter region connected to the barrier region, wherein the barrier region extends between the base region and the emitter region.

A fourth aspect of this invention provides a method of fabricating a heterojunction bipolar transistor which comprises the steps of forming a collector region from first-conduction-type InP; and forming a base region from second-conduction-type $In_x(Ga_yAl_{1-y})_{1-x}As$ where the letters "x" and "y" denote predetermined atomic fractions, wherein the atomic fraction "x" is in the range of 0.52 to 0.53 and the atomic fraction "y" is in the range of 0.35 to 0.72, the base region being connected to tile collector region.

A fifth aspect of this invention provides a method of fabricating a heterojunction bipolar transistor which comprises the steps of forming a collector region from first-conduction-type InP; forming a base region from second-conduction-type InP, the base region being connected to the collector region; forming a first emitter region from first-conduction-type $In_x(Ga_yAl_{1-y})_{1-x}P$ where the letters "x" and "y" denote predetermined atomic fractions, wherein the atomic fraction "x" is in the range of 0.7 to 0.9 and the atomic fraction "y" is in the range of 0.0 to 0.9, the first emitter region being connected to the base region; and forming a second emitter region connected to the first emitter region, wherein the first emitter region extends between the base region and the second emitter region.

A sixth aspect of this invention provides a method of fabricating a heterojunction bipolar transistor which comprises the steps of forming a collector region from first-conduction-type InP; forming a base region from second-conduction-type InP, the base region being connected to the collector region; forming a barrier region from non-doped $In_x(Ga_yAl_{1-y})_{1-x}P$ where the letters "x" and "y" denote predetermined atomic fractions, wherein the atomic fraction "x" is in the range of 0.7 to 0.9 and the atomic fraction "y" is in the range of 0.0 to 0.9, the barrier region being connected to the base region; and forming an emitter region connected to the barrier region, wherein the barrier region extends between the base region and the emitter region.

DESCRIPTION OF THE PRIOR ART

IEEE Electron Device Letters, Vol. 10, No. 6, June, 1989, disclose a first prior art HBT (heterojunction bipolar transistor). The first prior art HBT is believed to have a structure such as shown in FIG. 1.

The first prior art HBT was fabricated as follows. With reference to FIG. 1, a semi-insulating InP substrate 11 was prepared. A first contact layer (a subcollector) 12 made of n-type InGaAs, a collector layer 13 made of n-type InGaAs, a base layer 14 made of p-type InGaAs, an emitter layer 15 made of n-type InP, and a second contact layer (an emitter cap) 16 made of n-type InGaAs were sequentially formed on the substrate 11 by epitaxy. The first contact layer 12 had a high doping concentration (carrier density). The base layer 14 had a high doping concentration (carrier density). The second contact layer 16 had a high doping concentration (carrier density). An emitter mesa, a base mesa, and a collector mesa were sequentially formed by wet etching processes. Then, an emitter electrode, a base electrode, and a collector electrode were formed.

Figure 1:
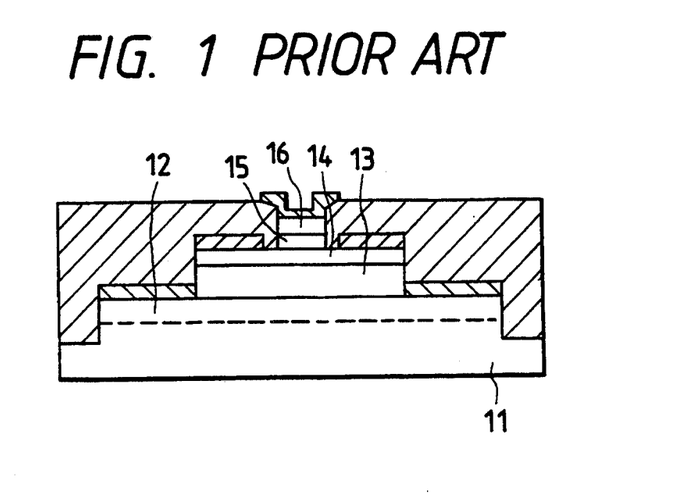
FIG. 1 is a sectional view of a first prior art heterojunction bipolar transistor.

Regarding the first prior art HBT of FIG. 1, a unity current gain cutoff frequency of 165 GHz is realized with a high emitter current density and extreme nonequilibrium electron transport in the InGaAs base and the collector depletion region. Generally, InGaAs has a band gap of 0.76 eV which is smaller than that of GaAs or Si. Thus, the first prior art HBT attains a lower turn-on voltage and is advantageous in power dissipation or power economy. Furthermore, the InP substrate of the first prior art HBT is better than a GaAs substrate in thermal conductivity.

Figure 2:
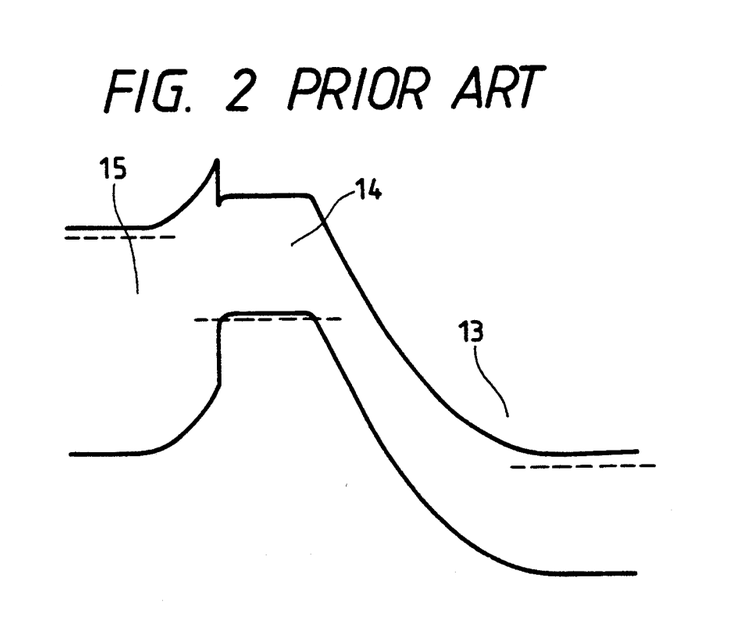
FIG. 2 is an energy band diagram of the prior art heterojunction bipolar transistor of FIG. 1.

As shown in FIG. 2, the first prior art HBT has a large energy separation between tile Γ-L valleys which enables a short intrinsic transit time.

The first prior art HBT of FIGS. 1 and 2 has the following problem. Since the collector is made of InGaAs having a narrow energy gap, a withstand voltage between the emitter and the collector is equal to a low level of about 4.0 V. Such a low withstand voltage makes the first prior art HBT unsuited to a practical circuit.

Figure 3:
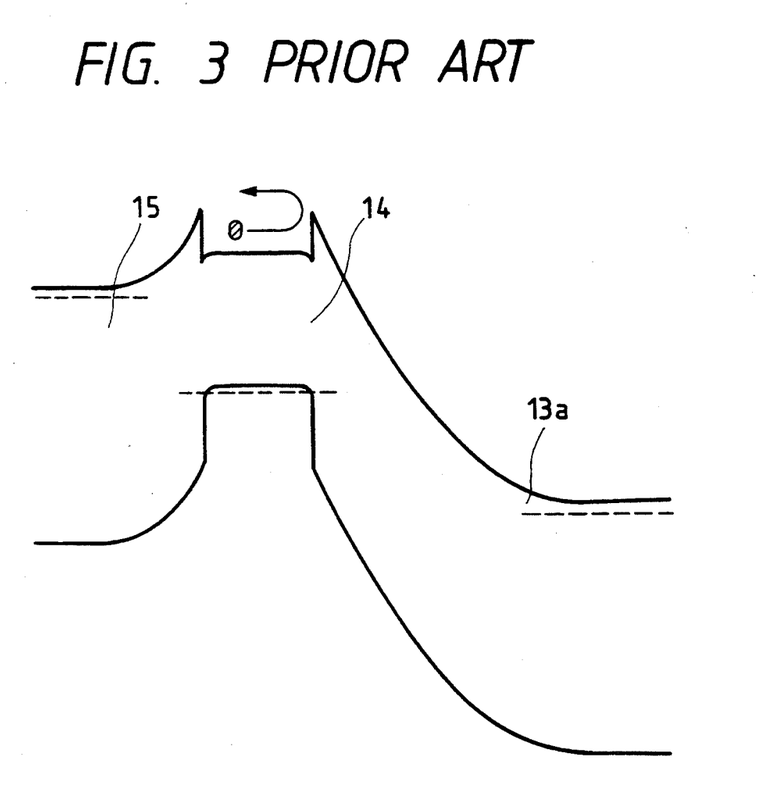
FIG. 3 is an energy band diagram of a second prior art heterojunction bipolar transistor.

FIG. 3 shows a second prior art HBT which is similar to the first prior art HBT of FIGS. 1 and 2 except that an n-type InP collector layer 13a is used instead of the n-type InGaAs collector layer 13. As shown in FIG. 3, the second prior art HBT also has a large energy separation between the Γ-L valleys which enables a short intrinsic transit time.

Figure 4:
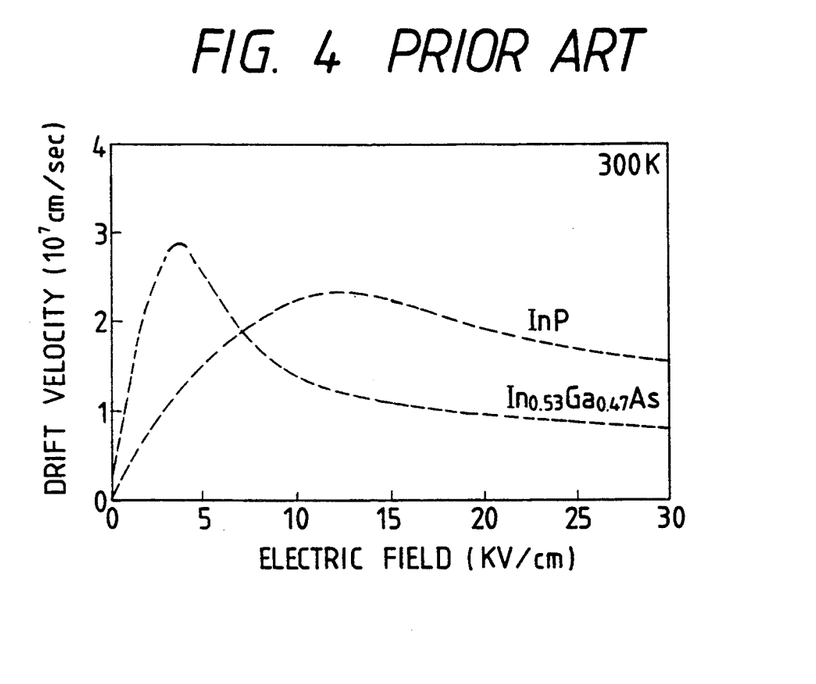
FIG. 4 is a diagram showing the relation between the average electron drift velocity and the intensity of an applied electric field in InP and $In_{0.53}Ga_{0.47}As$.

A description will now be given of comparison between InP and InGaAs. FIG. 4 shows the relation between the average electron drift velocity and the intensity of an applied electric field in InP and $In_{0.53}Ga_{0.47}As$ (see IEEE Transactions on Electron Devices, vol. 36, No. 10, pp. 2344-2352, October, 1989). Under normal conditions of bias voltages in HBT's, the base region and the collector depletion region are subjected to electric field having intensities of several tens of KV/cm. It is thus understood from FIG. 4 that, under such normal conditions, InP enables a higher average electron velocity than that prodded by InGaAs.

The second prior art HBT of FIG. 3 has the following problem. There is a large conduction band offset $\Delta Ec$ of 0.26 eV at the boundary between the base and the collector which constitutes an InGaAs/InP heterojunction. At a low collector bias voltage, the large conduction band offset $\Delta Ec$ provides a great barrier which blocks movement of electrons from the base toward the collector. Blocking the electron movement reduces a current gain (also see Appl. Phys. Lett., vol. 47, pp. 28-30, 1985).

The Japanese Institute of Electronics, Information and Communication Engineers, Technical Study Report, ED 89-147, 1990, discloses a third prior art HBT that is a fully self-aligned AlGa/GaAs HBT with an AlGaAs passivation layer.

Figure 5:
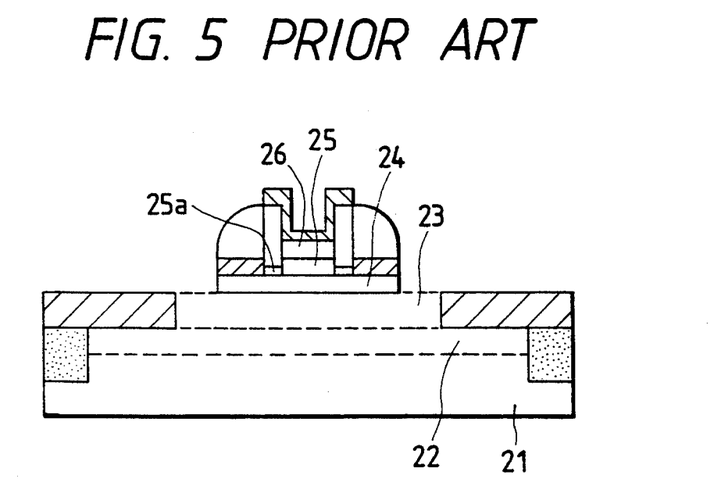
FIG. 5 is a sectional view of a third prior art heterojunction bipolar transistor.

FIG. 5 shows the structure of the third prior art HBT. The third prior art HBT was fabricated as follows. With reference to FIG. 5, a semi-insulating GaAs substrate 21 was prepared. A first contact layer (a subcollector) 22 made of n-type GaAs, a collector layer 23 made of n-type GaAs, a base layer 24 made of p-type GaAs, an emitter layer 25 made of n-type AlGa, and a second contact layer (an emitter cap) 26 made of n-type GaAs were sequentially formed on the substrate 21 by epitaxy. The first contact layer 22 had a high doping concentration (carrier density). The base layer 24 had a high doping concentration (carrier density). The second contact layer 26 had a high doping concentration (carrier density). An emitter mesa, a base mesa, and a collector mesa were sequentially formed. A thin AlGa layer 25a was left around the AlGaAs emitter mesa. The thin AlGaAs layer 25a served as a protective layer for an extrinsic base region. Then, an emitter electrode, a base electrode, and a collector electrode were formed.

In the third prior art HBT of FIG. 5, the thin AlGaAs layer 25a forms a depletion region which is a barrier with respect to electrons injected into the extrinsic base region. Thus, a recombination current in the extrinsic base region can be reduced.

The third prior art HBT of FIG. 5 has the following problem. In order to make the AlGaAs layer 25a into a good depletion layer, it is necessary to limit the thickness of the AlGaAs layer 25a to a small value equal to about several tens of nm. Generally, it is difficult to form a uniform AlGaAs layer having such a small thickness.

DESCRIPTION OF THE FIRST PREFERRED EMBODIMENT

Figure 6:
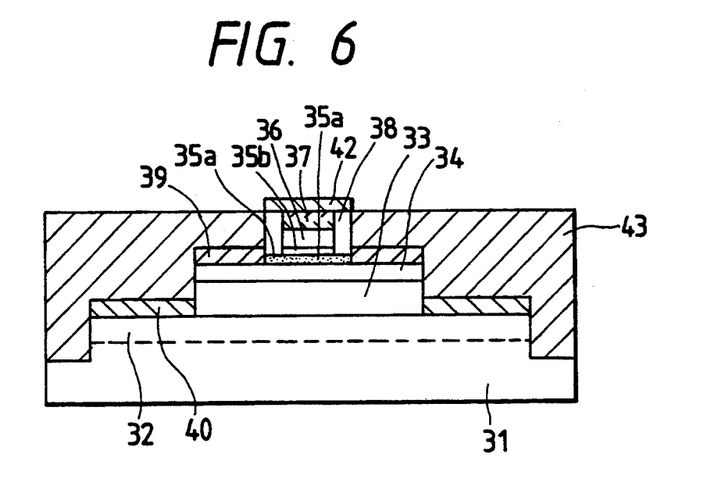
FIG. 6 is a sectional view of a heterojunction bipolar transistor according to a first embodiment of this invention.

With reference to FIG. 6, a heterojunction bipolar transistor (HBT) includes a semi-insulating InP substrate 31. A first contact region (a subcollector) 32 made of n-type $In_{0.53}Ga_{0.47}As$ extends on the substrate 31. A collector region 33 made of n-type InP extends on central and inner areas of the first contact regions 32. A collector electrode 40 made of AuGe/Ni/Au extends on an outer area of the first contact layer 32. The collector electrode 40 surrounds the collector region 33, and thus extends outward of the collector region 33. A base region 34 made of p-type $(In_{0.53}Ga_{0.47}As)0.5(In_{0.52}Al_{0.48}As)_{0.5}$ is superposed on the collector region 33. Good lattice match is maintained among the substrate 31, the first contact region 32, the collector region 33, and the base region 34.

A first emitter region 35a made of n-type InP extends on a central area, that is, an intrinsic area, of the base region 34. A second emitter region 35b made of n-type $(In_{0.53}Ga_{0.47}As)_{0.5}(In_{0.52}Al_{0.48}As)_{0.5}$ extends on central and inner areas of the first emitter region 35a. A second contact region 36 made of n-type $In_{0.53}Ga_{0.47}As$, and an emitter electrode 37 made of WSi are successively superposed on the second emitter region 35b. Side walls 38 made of $SiO_2$ extend on an outer area of the first emitter region 35a. The side walls 38 surround the lamination composed of the second emitter region 35b, the second contact region 36, and the emitter electrode 37. Thus, the side walls 38 extend outward of the lamination composed of the second emitter region 35b, the second contact region 36, and the emitter electrode 37. An emitter leading electrode 42 made of Ti/Pt/Au extends on the emitter electrode 37 and the side walls 38.

A base electrode 39 made of AuMn extends an outer area, that is, an extrinsic area, of the base region 34. The base electrode 39 surrounds the first emitter region 35a and a lower part of the side walls 38. Thus, the base electrode 39 extends outward of the first emitter region 35a and a lower part of the side walls 38.

The substrate 31, the first contact region 32, the collector electrode 40, the collector region 33, the base region 34, the base electrode 39, and the side walls 39 are coated with protective material 43 using polyimide.

Figure 7:
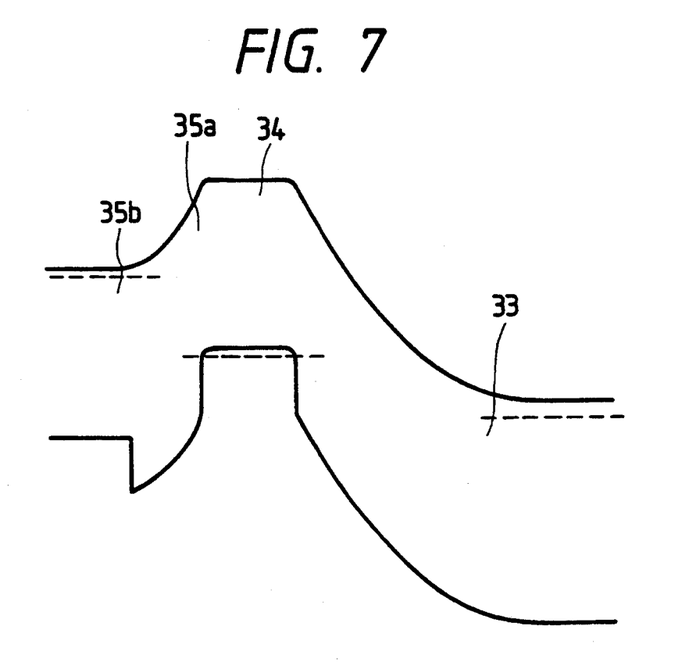
FIG. 7 is an energy band diagram of the heterojunction bipolar transistor of FIG. 6.

As shown in FIG. 7, an appreciable conduction band offset $\Delta Ec$ is absent from the boundary between the base region 34 and the collector region 33. Thus, electrons can smoothly move from the base region 34 to the collector region 33. The absence of an appreciable conduction band offset $\Delta Ec$ is caused by the fact that the base region 34 is made of p-type $(In_{0.53}Ga_{0.47}As)_{0.5}(In_{0.52}Al_{0.48}As)_{0.5}$ and the collector region 33 is made of n-type InP. As shown in FIG. 7, there is a large valence band offset $\Delta Ev$ of 0.25 eV at the boundary between the base region 34 and the first emitter region 35a. Thus, the injection of holes from the base region 34 into the first emitter region 35a can be sufficiently prevented. The presence of a large valence band offset $\Delta Ev$ is caused by the fact that the base region 34 is made of p-type $(In_{0.53}Ga_{0.47}As)_{0.5}(In_{0.52}Al_{0.48}As)_{0.5}$ and the first emitter region 35a is made of n-type InP. The collector region 33 is made of n-type InP and electrons can move at a high velocity in a collector depletion area, so that good high-frequency characteristics of the HBT are enabled. Since InP is wide-gap material, a higher withstand voltage between the emitter and the collector is enabled. The first emitter region 35a forms a depletion area extending on the extrinsic area of the base region 34, and the depletion area reduces a recombination current in the extrinsic area of the base region 34.

Figure 8:
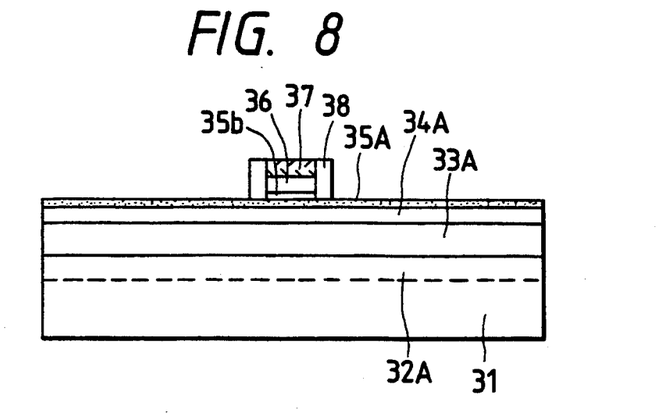
FIGS. 8–10 are sectional views of a wafer in different states which occur during the fabrication of the heterojunction bipolar transistor of FIG. 6.

The HBT of FIG. 6 was fabricated as follows. First, a semi-insulating InP substrate 31 was prepared. As shown in FIG. 8, a first contact layer 32A, a collector layer 33A a base layer 34A, a first emitter layer 35A, a second emitter layer, and a second contact layer were sequentially formed on the substrate 31 by molecular beam epitaxy.

The first contact layer 32A was made of n-type $In_{0.53}Ga_{0.47}As$ having a doping concentration (carrier density) of $3\times 10^{19}/cm^3$. The first contact layer 32A had a thickness of 500 nm. The collector layer 33A was made of n-type InP having a doping concentration (carrier density) of $2\times 10^{16}/cm^3$. The collector layer 33A had a thickness of 300 nm. The base layer 34A was made of p-type $(In_{0.53}Ga_{0.47}As)_{0.5}(In_{0.52}Al_{0.48}As)_{0.5}$ having a doping concentration (carrier density) of $4 \times 10^{19}/cm^3$. The base layer 34A had a thickness of 100 nm. The first emitter layer 35A was made of n-type InP having a doping concentration (carrier density) of $4 \times 10^{19}/cm^3$. The first emitter layer 35A had a concentration (carrier density) of $5\times 10^{17}/cm^3$. The second thickness of 30 nm. The second emitter layer was made of n-type $(In_{0.53}Ga_{0.47}As)_{0.5}(In_{0.52}Al_{0.48}As)_{0.5}$ having a doping concentration (carrier density) of $5\times 10^{17}/cm^3$. The second emitter layer had a thickness of 200 nm. The second contact layer was made of n-type $In_{0.53}Ga_{0.47}As$ having a doping concentration (carrier density) of $4\times 10^{19}/cm^3$. The second contact layer had a thickness of 100 nm.

An emitter electrode 37 was formed on a given area of the second contact layer by pattern formation using sputter vapor deposition and reactive ion etching (RIE). The emitter electrode 37 was made of WSi. The portions of the second emitter layer and the second contact layer which extended outward of the emitter electrode 37 were removed by an etching process using aqueous solution containing phosphoric acid and hydrogen peroxide. During this etching process, the emitter electrode 37 was used as a mask, and the first emitter layer 35A was used as a stopper. The remaining portions of the second emitter layer and the second contact layer formed a second emitter region 35b and a second contact region 36 respectively. As a result of this etching process, the portion of the first emitter layer 35A which extended outward of the second emitter region 35b was exposed. Side walls 38 made of $SiO_2$ were formed on an exposed area of the first emitter layer 35A. The side walls 38 surrounded the lamination composed of the second emitter region 35b, the second contact region 36, and the emitter electrode 37. Thus, the side walls 38 extended outward of the lamination composed of the second emitter region 35b, the second contact region 36, and the emitter electrode 37.

Figure 9:
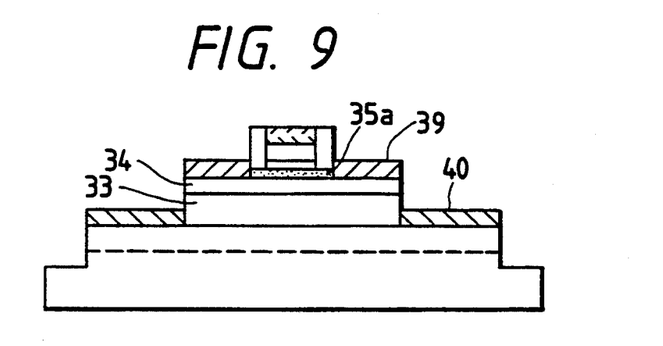

The portion of the first emitter layer 35A which extended outward of the side walls 38 was removed by a wet etching process using aqueous solution containing hydrochloric acid. As shown in FIG. 9, the remaining portion of the first emitter layer 35A formed a first emitter region 35a which extended below the second emitter region 35b and the side walls 38. As a result of this etching process, the portion of the base layer 34A which extended outward of the first emitter region 35a was exposed. A base electrode layer was formed on the exposed area of the base layer 34A while the emitter electrode 37 was used as a mask. The base electrode layer was made of AuMn. The base electrode layer surrounded the first emitter region 35a and a lower part of the side walls 38. Thus, the base electrode layer extended outward of the first emitter region 35a and a lower part of the side walls 38. A photoresist having a predetermined pattern was provided on a given area of the base electrode layer. The exposed portion of the base electrode layer was removed by an etching process using ion milling. During this etching process, the photoresist was used as a mask. The photoresist was removed after the etching process. The remaining portion of the base electrode layer formed a base electrode 39 (see FIG. 9). The portions of the base layer 34A and the collector layer 33A which extended outward of the base electrode 39 were removed by a wet etching process. The remaining portions of the base layer 34A and the collector layer 33A formed a base region 34 and a collector region 33 respectively. As a result of this etching process, the area of the first contact layer 32A which extended outward of the collector region 33 was exposed. A collector electrode layer was formed on the exposed area of the first contact layer 32A by lift off. The collector electrode layer had a lamination of three sub layers of AuGe, Ni, and Au respectively. A photoresist having a predetermined pattern was provided on a given area of the collector electrode layer. The exposed portion of the collector electrode layer was removed by an etching process using ion milling. During this etching process, the photoresist was used as a mask. The photoresist was removed after the etching process.

Figure 10:
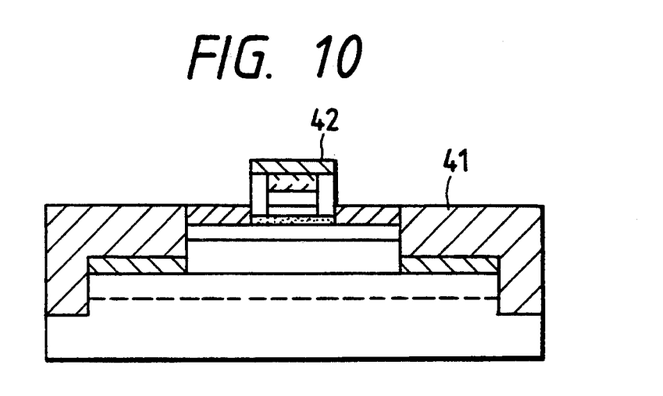

The remaining portion of the collector electrode layer formed a collector electrode 40 (see FIG. 9). A collector mesa was formed by a wet etching process. As shown in FIG. 10, a protective member 41 made of polyimide was formed on the upper surfaces of the wafer to provide a flat upper surface of the HBT. An emitter-leading electrode 42 was formed on the emitter electrode 37 and the side walls 38. The emitter-leading electrode 42 had a lamination of three sub layers of Ti, Pt, and Au respectively.

DESCRIPTION OF THE SECOND PREFERRED EMBODIMENT

Figure 11:
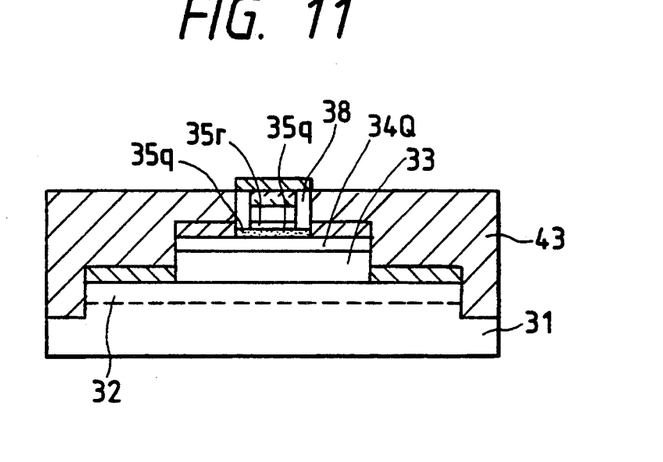
FIG. 11 is a sectional view of a heterojunction bipolar transistor according to a second embodiment of this invention.

FIG. 11 shows a second embodiment of this invention which is similar to the embodiment of FIGS. 6–10 except for design changes described hereinafter.

In the embodiment of FIG. 11, a base region 34Q is made of p-type InP having a doping concentration (carrier density) of $1 \times 10^{19}/cm^3$. The base region 34Q has a thickness of 100 nm. In addition, a first emitter region 35q is made of n-type $(Al_{0.7}Ga_{0.3})_{0.2}In_{0.8}P$ having a doping concentration (carrier density) of $5 \times 10^{17}/cm^3$. The first emitter region 35q has a thickness of 20 nm. Furthermore, a second emitter region 35r is made of n-type $In_{0.52}Al_{0.48}As$ having a doping concentration (carrier density) of $5 \times 10^{17}/cm^3$. The second emitter region 35r has a thickness of 200 nm.

An HBT of FIG. 1 I was fabricated similarly to the fabrication of the HBT of FIGS. 6–10. During the fabrication of the HBT of FIG. 11, an unnecessary portion of a second emitter layer was removed by an etching process while a first emitter layer was used as an etching stopper.

Figure 12:
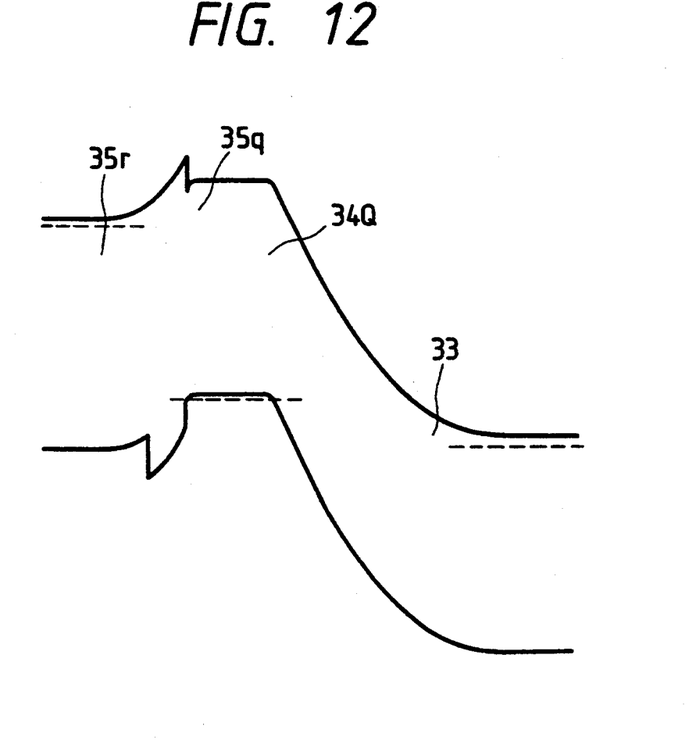
FIG. 12 is an energy band diagram of the heterojunction bipolar transistor of FIG. 11.

As shown in FIG. 12, there is a large valence band offset ΔEv of 0.16 eV at the boundary between the base region 34Q and the first emitter region 35q. Thus, the injection of holes from the base region 34Q into the first emitter region 35q can be sufficiently prevented. The presence of a large valence band offset ΔEv is caused by the fact that the base region 34Q is made of p-type InP and the first emitter region 35q is made of n-type $(Al_{0.7}Ga_{0.3})_{0.2}In_{0.8}P$. As shown in FIG. 12, an appreciable conduction band offset ΔEc is absent from the boundary between the first emitter region 35q and the second emitter region 35r. The absence of an appreciable conduction band offset ΔEc is caused by the fact that the first emitter region 35q is made of n-type $(Al_{0.7}Ga_{0.3})_{0.2}In_{0.8}P$ and the second emitter region 35r is made of n-type $In_{0.52}Al_{0.48}As$. Regarding the first emitter region 35q made of $(Al_{0.7}Ga_{0.3})_{0.2}In_{0.8}P$, since its layer thickness being 20 nm is much less than its critical layer thickness, the crystal growth can be done without causing defects. In other words, a small thickness of the first emitter region 35q ensures that good lattice match is maintained between the base region 34Q and the first emitter region 35q. The first emitter region 35q forms a depletion area extending on an extrinsic area of the base region 34Q, and the depletion area reduces a recombination current in the extrinsic area of the base region 34Q.

DESCRIPTION OF THE THIRD PREFERRED EMBODIMENT

Figure 13:
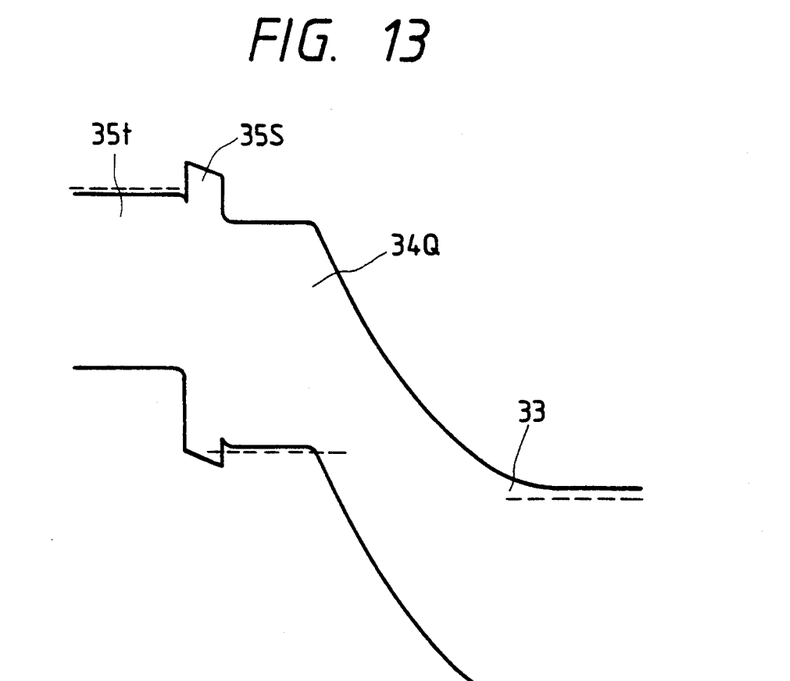
FIG. 13 is an energy band diagram of a heterojunction bipolar transistor according to a third embodiment of this invention.

FIG. 13 shows a third embodiment of this invention which is similar to the embodiment of FIGS. 1 I and 12 except for design changes described hereinafter.

In the embodiment of FIG. 13, a barrier region 35s made of non-doped $(Al_{0.7}Ga_{0.3})_{0.2}In_{0.8}P$ is provided instead of the first emitter region 35q (see FIGS. 11 and 12). The barrier region 35s has a thickness of 10 nm. Furthermore, an emitter region 35t is provided instead of the second emitter region 35r (see FIGS. 11 and 12). The emitter region 35t is made of n-type $(In_{0.53}Ga_{0.47}As)_{0.5}(In_{0.52}Al_{0.48}As)_{0.5}$ having a doping concentration (carrier density) of $2 \times 10^{18}/cm^3$. The emitter region 35t has a thickness of 200 nm.

There is a conduction band offset ΔEc of 0.23 eV at the boundary between a base region 34Q and the barrier region 35s. In addition, there is a valence band offset ΔEv of 0.16 eV at the boundary between the base region 34Q and the barrier region 35s. During operation of an HBT of FIG. 13, electrons are injected into the base region 34Q through the barrier region 35s according to the tunnel effect.

DESCRIPTION OF THE FOURTH PREFERRED EMBODIMENT

A fourth embodiment of this invention is generic to the embodiment of FIGS. 6–10, and is similar to the embodiment of FIGS. 6–10 except for design changes described hereinafter.

In the fourth embodiment, a base region 34 (see FIG. 6) is made of p-type $In_x(Ga_yAl_{1-y})_{1-x}As$ where the letters "x" and "y" denote atomic fractions which are predetermined as will be explained later. It should be noted that, in the embodiment of FIGS. 6–10, the base region 34 is made of $(In_{0.53}Ga_{0.47}As)0.5\ In_{0.52}Al_{0.48}As)0.5$ which is approximately rewritten into $In_{0.525}(Ga_{0.495}Al_{0.505})_{0.475}As$.

Figure 14:
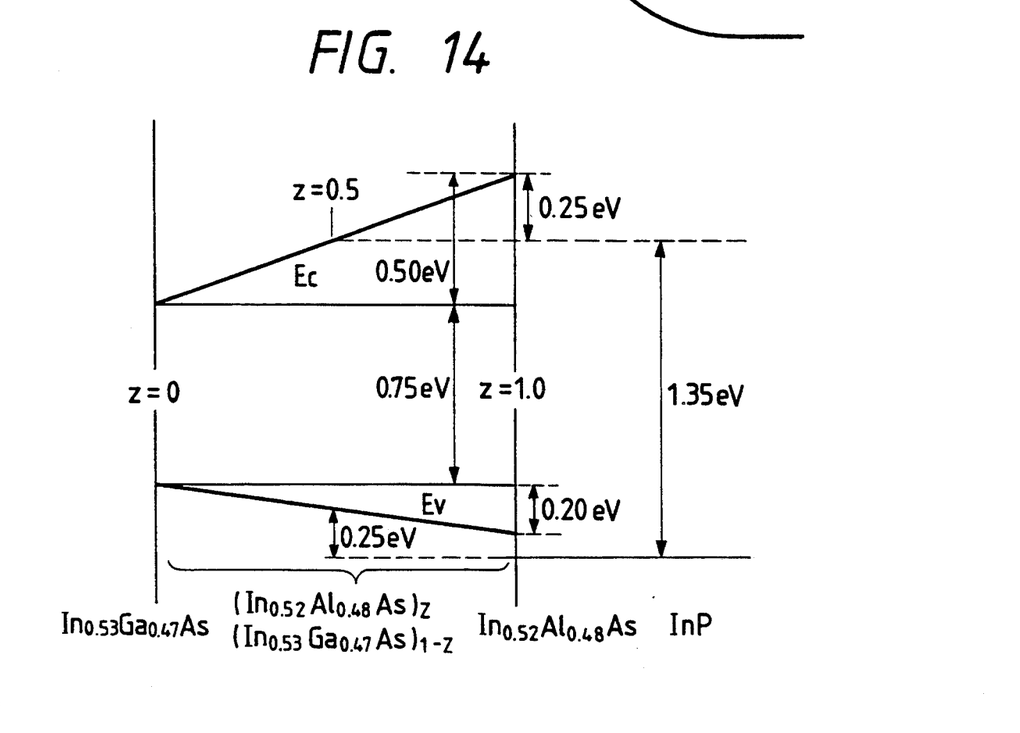
FIG. 14 is a fiat energy band diagram of the combination of $In_{0.53}Ga_{0.47}As$, $(In_{0.52}Al_{0.48}As)_z(In_{0.53}Ga_{0.47}As)_{1-z}$, $In_{0.52}Al_{0.48}As$, and InP.

FIG. 14 is a flat energy band diagram of the combination of $In_{0.53}Ga_{0.47}As$, $(In_{0.52}Al_{0.48}As)_z(In_{0.53}Ga_{0.47}As)_{1-z}$, $In_{0.52}Al_{0.48}As$, and InP in which good lattice match is maintained among the substances. It should be noted that the letter "z" denotes an atomic fraction which varies between 0 to 1. It is possible to estimate good ranges of the atomic fractions "x" and "y" in p-type $In_x(Ga_yAl_{1-y})_{1-x}As$ by referring to FIG. 14.

As described previously regarding the embodiment of FIGS. 6–10, the absence of an appreciable conduction band offset ΔEc from the boundary between the base region 34 and a collector region 33 is desirable to enable smooth movement of electrons from the base region 34 to the collector region 33. In addition, it is desirable to provide a large valence band offset ΔEv at the boundary between the base region 34 and a first emitter region 35a (see FIG. 6) to sufficiently prevent the injection of holes from the base region 34 into the first emitter region 35a. In view of the above-mentioned points, good ranges of the atomic fractions "x" and "y" in p-type $In_x(Ga_yAl_{1-y})_{1-x}As$ are determined by referring to FIG. 14. Specifically, it is preferable that the atomic fraction "x" is in the range of 0.52 to 0.53 and the atomic fraction "y" is in the range of 0.35 to 0.72. It is most preferable that the atomic fraction "x" is in the range of 0.524 to 0.526 and the atomic fraction "y" is in the range of 0.485 to 0.505.

DESCRIPTION OF THE FIFTH PREFERRED EMBODIMENT

A fifth embodiment of this invention is generic to the embodiment of FIGS. 11 and 12, and is similar to the embodiment of FIGS. 11 and 12 except for design changes described hereinafter.

In the fifth embodiment, a first emitter region 35q (see FIG. 11) is made of n-type $In_x(Ga_yAl_{1-y})_{1-x}P$ where the letters "x" and "y" denote atomic fractions which are predetermined as will be explained later. It should be noted that, in the embodiment of FIGS. 11 and 12, the first emitter region 35q is made of n-type $(Al_{0.7}Ga_{0.3})_{0.2}In_{0.8}P$ which is rewritten into $In_{0.8}(Ga_{0.3}Al_{0.7})_{0.2}P$.

Figure 15:
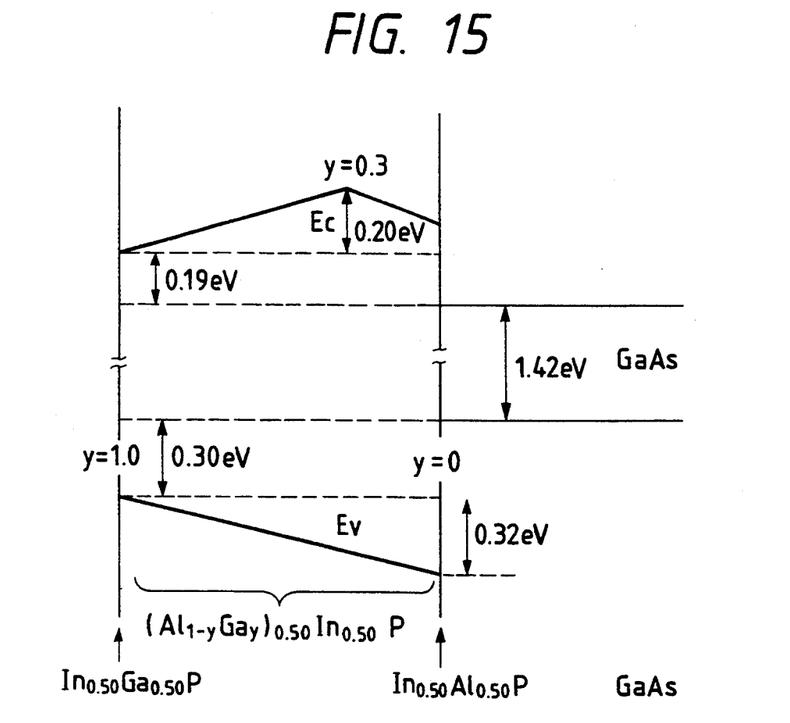
FIG. 15 is a flat energy band diagram of the combination of $In_{0.5}Ga_{0.5}P$, $(Al_{1-y}Ga_y)_{0.5}In_{0.5}P$, $In_{0.5}Al_{0.5}P$, and GaAs.

FIG. 15 is a fiat energy band diagram of the combination of $In_{0.5}Ga_{0.5}P$, $(Al_{1-y}Ga_y)_{0.5}In_{0.5}P$, $In_{0.5}Al_{0.5}P$, and GaAs in which good lattice match is maintained among the substances. It should be noted that the letter "y" denotes an atomic fraction which varies between 0 to 1. Although GaAs is used in the case regarding FIG. 15, it is possible to estimate good ranges of the atomic fractions "x" and "y" in n-type $In_x(Ga_yAl_{1-y})_{1-x}P$ by referring to FIG. 15.

Figure 16:
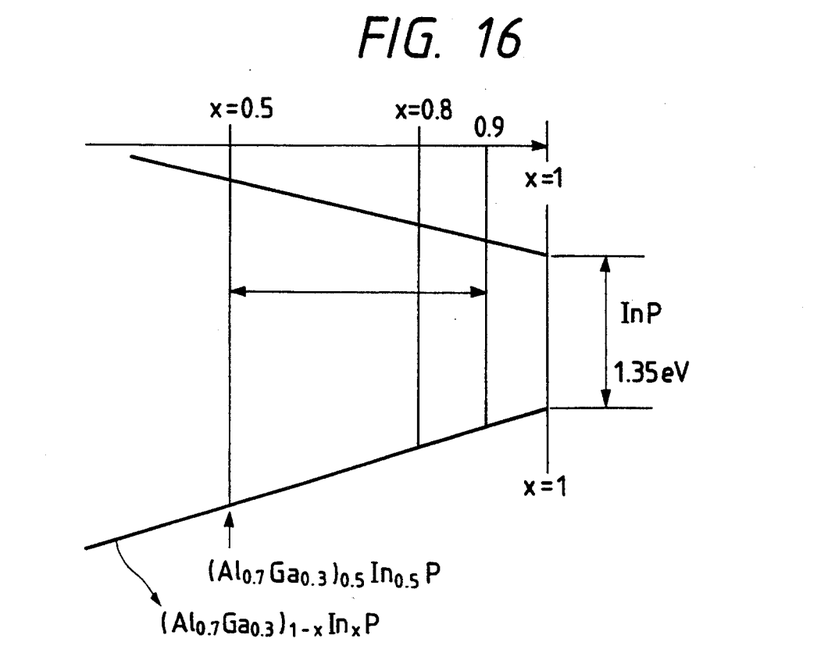
FIG. 16 is a fiat energy band diagram of the combination of $(Al_{0.7}Ga_{0.3})_{1-x}In_xP$ and InP.

FIG. 16 is a fiat energy band diagram of the combination of $(Al_{0.7}Ga_{0.3})_{1-x}In_xP$ and InP. It is possible to estimate good ranges of the atomic fractions "x" and "y" in n-type $In_x(Ga_yAl_{1-y})_{1-x}P$ by referring to FIG. 16.

As described previously regarding the embodiment of FIGS. 11 and 12, it is desirable to provide a large valence band offset ΔEv at the boundary between a base region 34Q (see FIG. 11) and the first emitter region 35q to sufficiently prevent the injection of holes from the base region 34Q into the first emitter region 35q. In view of this point, good ranges of the atomic fractions "x" and "y" in n-type $In_x(Ga_yAl_{1-y})_{1-x}P$ are determined by referring to FIGS. 15 and 16. Specifically, it is preferable that the atomic fraction "x" is in the range of 0.7 to 0.9 and the atomic fraction "y" is in the range of 0.0 to 0.9. It is most preferable that the atomic fraction "x" is in the range of 0.79 to 0.81 and the atomic fraction "y" is in the range of 0.29 to 0.31.

What is claimed is:

1. A heterojunction bipolar transistor comprising:
    a collector region made of first-conduction-type InP; and
    a base region connected to the collector region and made of second-conduction-type $In_x(Ga_yAl_{1-y})_{1-x}As$ where the letters "x" and "y" denote predetermined atomic fractions, wherein the atomic fraction "x" is in the range of 0.52 to 0.53 and the atomic fraction "y" is in the range of 0.35 to 0.72,
    further including a semi-insulating substrate of InP, a subcollector region of first conduction type $In_xGa_{1-x}As$ on said substrate, and wherein said collector region is situated on said subcollector region.

2. The heterojunction bipolar transistor of claim 1, wherein the atomic fraction "x" is in the range of 0.524 to 0.526 and the atomic fraction "y" is in the range of 0.485 to 0.505.

3. The heterojunction bipolar transistor of claim 1, further comprising a first emitter region made of first-conduction-type InP and connected to the base region, and a second emitter region connected to the first emitter region and made of first-conduction-type $In_x(Ga_yAl_{1-y})_{1-x}As$, wherein the first emitter region extends between the base region and the second emitter region.

4. A method of fabricating a heterojunction bipolar transistor, comprising the steps of:
    forming a collector region from first-conduction-type InP; and
    forming a base region from second-conduction-type $In_x(Ga_yAl_{1-y})_{1-x}As$ where the letters "x" and "y" denote predetermined atomic fractions, wherein the atomic fraction "x" is in the range of 0.52 to 0.53 and the atomic fraction "y" is in the range of 0.35 to 0.72, the base region being connected to the collector region,
    wherein said step of forming a collector region further comprises the steps of:
    forming a semi-insulating substrate of InP,
    forming a subcollector region of first conduction type $In_xGa_{1-x}As$ on said substrate, and
    forming said collector region on said subcollector region.

5. The heterojunction transistor of claim 1, further comprising a collector electrode on said subcollector region, said collector electrode surrounding and in contact with said collector region.

* * * * *